United States Patent [19]

Taguchi et al.

[11] Patent Number: 6,051,490
[45] Date of Patent: Apr. 18, 2000

[54] METHOD OF FORMING WIRINGS

[75] Inventors: Mitsuru Taguchi, Tokyo; Keiichi Maeda, Kanagawa, both of Japan

[73] Assignee: Sony Corporation, Tokyo, Japan

[21] Appl. No.: 08/976,314

[22] Filed: Nov. 21, 1997

Related U.S. Application Data

[62] Division of application No. 08/250,332, May 27, 1994, which is a continuation of application No. 07/981,540, Nov. 25, 1992, abandoned.

[30] Foreign Application Priority Data

Nov. 29, 1991  [JP]  Japan ..................................... 3-340263

[51] Int. Cl.$^7$ ............................................. H01L 21/4763
[52] U.S. Cl. .................. 438/618; 438/622; 438/625; 438/629; 438/637; 438/643; 438/648; 438/653; 438/656; 438/660; 438/663; 438/688
[58] Field of Search ...................... 438/688, 618, 438/622, 629, 625, 637, 643, 644, 648, 653, 654, 656, 660, 663

[56] References Cited

U.S. PATENT DOCUMENTS

| | | |
|---|---|---|
| 3,694,700 | 9/1972 | Low et al. ................................ 317/101 |
| 4,154,874 | 5/1979 | Howard et al. . |
| 4,673,623 | 6/1987 | Gardner et al. . |
| 4,783,248 | 11/1988 | Kohlhase et al. . |
| 4,810,342 | 3/1989 | Inoue . |
| 4,816,424 | 3/1989 | Watanabe et al. . |
| 4,910,580 | 3/1990 | Kuecher et al. . |
| 4,976,839 | 12/1990 | Inoue . |
| 5,036,382 | 7/1991 | Yamaha . |
| 5,071,791 | 12/1991 | Inoue et al. . |
| 5,108,570 | 4/1992 | Wang . |
| 5,108,951 | 4/1992 | Chen et al. . |
| 5,117,276 | 5/1992 | Thomas et al. . |
| 5,270,254 | 12/1993 | Chen et al. . |
| 5,421,871 | 6/1995 | Witt ....................................... 204/192.25 |
| 5,523,626 | 6/1996 | Hayashi et al. ........................... 257/763 |
| 5,525,837 | 6/1996 | Choudhury ................................ 257/751 |
| 5,552,341 | 9/1996 | Lee ............................................ 437/192 |
| 5,567,987 | 10/1996 | Lee ............................................ 257/751 |
| 5,569,961 | 10/1996 | Lee ............................................ 257/751 |
| 5,572,071 | 11/1996 | Lee ............................................ 257/751 |
| 5,572,072 | 11/1996 | Lee ............................................ 257/751 |
| 5,612,254 | 3/1997 | Mu et al. ................................... 438/634 |

(List continued on next page.)

FOREIGN PATENT DOCUMENTS

| | | |
|---|---|---|
| 0 168 828 | 1/1986 | European Pat. Off. . |
| 54-6461 | 1/1979 | Japan . |
| 58-101454 | 6/1983 | Japan . |
| 59-210656 | 11/1984 | Japan . |
| 61-90445 | 5/1986 | Japan . |
| 62-113421 | 5/1987 | Japan . |

OTHER PUBLICATIONS

Wolf et al, Silicon Processing 1986 Lattice Press, pp. 365–374 and 56–58.

Hoffman, Individual Wafer Metallization Utilizing Load–Locked, Close–Coupled Conical Magnetron Sputtering, *Solid State Technology*, vol. 24, No. 2, Feb. 1981, pp. 105–111 and 120.

Ghandi, *VLSI Fabrication Principles*, 1983, John Wiley & Sons, pp. 427–429.

Ho et al, "Sputtered Metallurgy Process for Electromigration Improvement of Al–Cu Interconnections", *IBM Technical Disclosure Bulletin*, vol. 21, No. 11, Apr. 1979, pp. 4527–4528.

*Primary Examiner*—Jey Tsai
*Assistant Examiner*—Lynne A. Gurley
*Attorney, Agent, or Firm*—Hill & Simpson

[57] ABSTRACT

A method of forming wirings which includes forming a film of a silicon-containing metal layer at a high temperature on an underlying metal, thereby forming a silicon alloy layer which includes the underlying metal and the silicon-containing metal during film formation. In a case of forming wirings by a silicon-containing metal layer, occurrence of Si nodules can be eliminated to obtain wirings of high reliability.

8 Claims, 20 Drawing Sheets

U.S. PATENT DOCUMENTS

| | | | |
|---|---|---|---|
| 5,614,437 | 3/1997 | Choudhury | 438/653 |
| 5,674,787 | 10/1997 | Zhao et al. | 438/627 |
| 5,739,579 | 4/1998 | Chiang et al. | 257/635 |
| 5,747,360 | 5/1998 | Nulman | 437/189 |
| 5,760,453 | 6/1998 | Chen | 257/529 |
| 5,843,843 | 12/1998 | Lee et al. | 438/688 |
| 5,851,917 | 12/1998 | Lee | 438/627 |
| 5,891,513 | 4/1999 | Dubin et al. | 427/98 |
| 5,953,626 | 9/1999 | Hause et al. | 438/622 |
| 5,965,942 | 10/1999 | Itoh et al. | 257/761 |

METHOD OF FORMING WIRINGS

This is a division, of application Ser. No. 08/250,332, pending filed May 27, 1997, which was a continuation of Ser. No. 07/981,540, filed Nov. 25, 1992 (now abandoned).

BACKGROUND OF THE INVENTION

1. Field of the Invention

The present invention concerns a method of forming wirings. The present invention can be utilized as a method of forming metal wirings, for example. In electronic materials (such as semiconductor device).

2. Description of the Prior Art

Wiring structures, for example, wirings for semiconductor devices such as LSI in the prior art are sometimes formed by forming films at a high temperature. For instance, Al series materials have often been used in view of their low resistivity and easy fabricability, and Al series alloys have been generally used therefor. The Al series alloys have usually been formed by a sputtering method, in which sputtering under heating, so-called, a high temperature sputtering method has also been used.

Among the Al series alloys, Si-containing alloy materials such as Al—Si or Al—Si—Cu have often been used with an aim of preventing penetration of Al in a portion of contact with a Si diffusion layer in a case where the underlying material is a silicon substrate. That is, Si-containing Al alloys comprise about 1 wt % of Si and, by incorporating Si in an amount generally greater than the solid solubilization limit (for example, 1 wt %) in Al, diffusion of Si from the Si substrate into Al in the portion of contact is prevented thereby suppressing Al from intruding into the Si substrate.

As the size of LSI devices has become finer in recent years, the size and the shape of a wiring width and a connection hole have been also, in which a problem of Si nodules has become serious in view of the reliability of the wirings. That is, since the width of wirings is reduced in a portion in which Si nodules occur in the wirings, it may be a worry of wiring disconnection due to increase of wiring resistivity or local increase in the current density. FIGS. 26(a), (b) and FIGS. 27(a), (b) show Al—Si wiring 30 in which Si nodule 14 occurs. As can be seen from cross sectional views of FIG. 26(b) and FIG. 27(b). as well as from FIG. 28 corresponding to FIG. 25, a Si nodule 14 occurs biting into the wiring 30 to reduce the wiring width in a portion shown by a reference numeral 15.

On the other hand, it has been known that the size and the number of Si nodules depend particularly on the heating temperature for a substrate upon forming an Al alloy film or heat treatment after the formation of the film such as Al sintering. In view of the above, it has been attempted to reduce the Si nodules by improving and optimizing the heating processes, thereby suppressing the undesired effect on the reliability. However, the Si nodules can not completely be eliminated after all by such a method. With the reasons as described above, there has been demanded for a drastic countermeasure capable of completely suppressing the occurrence of the Si nodules also in a case in which Al—Si is used as the Al series material.

Further, the foregoing problem may arise in any of the cases in the technique for forming wirings by film formation of a Si-containing metal layer.

OBJECT OF THE INVENTION

The present invention has been accomplished in view of the foregoing problems and it is an object thereof to provide a technique for forming wirings of high reliability by preventing occurrence of Si nodules in a case of forming wirings by a Si-containing metal layer.

SUMMARY OF THE INVENTION

The foregoing object can be attained in accordance with first aspect of the present invention concerning a method of forming wirings which comprises forming a film of a silicon-containing metal layer at a high temperature on an underlying metal, thereby forming a silicon alloy layer comprising the underlying metal and the silicon-containing metal.

The foregoing object can be attained in accordance with the second aspect of the present invention concerning a method of forming wirings as defined in the first aspect, wherein the silicon-containing metal layer is formed from a silicon-containing aluminum series material and the silicon-containing metal layer is formed by a high temperature sputtering.

The foregoing object can be attained in accordance with the third aspect of the present invention concerning a method forming wirings as defined in the first aspect, which comprises forming a film of a silicon-containing metal layer on an underlying metal and, subsequently, applying a heat treatment, thereby forming a silicon alloy layer comprising the underlying metal and the silicon-containing metal.

The foregoing object can be attained in accordance with the fourth aspect of the present invention concerning a method of forming wirings as defined the third aspect, wherein the silicon-containing metal layer is formed by sputtering.

The foregoing object can be attained in accordance with the fifth aspect of the present invention concerning a method of forming wirings as defined in the third or fourth aspect wherein the silicon-containing metal layer is formed from a silicon-containing aluminum series material.

The foregoing object can be attained in accordance with the sixth aspect of the present invention concerning a method of forming wirings as defined in any one of third to fifth aspects, wherein the heat treatment is applied by furnace annealing.

The foregoing object can be attained in accordance with the seventh aspect of the present invention concerning for a method of forming wirings as defined in any one of third to fifth aspects, wherein the heat treatment is applied by a RTA method.

The foregoing object can be attained in accordance with the eighth aspect of the present invention concerning a method of forming wirings as defined in any one of third to seventh aspects, wherein the beat treatment is continuously applied in vacuum after forming the film of the silicon-containing metal layer.

The foregoing object can be attained in accordance with the ninth aspect of the present invention concerning a method of forming wirings as defined in any one of the first to eighth aspects, wherein the underlying metal is a Ti series material.

The present invention has a great advantageous effect in a case where the silicon-containing metal layer is an aluminum series material, for example, Al—Si alloy and Al—Si—Cu alloy. Further, it is preferably applied in a case where the underlying metal is a Ti series material, for example, Ti and/or TiON or TiW.

In the first aspect of the present invention, film formation at a high temperature means that the silicon-containing metal is formed into a film by being heated in a molten or nearly molten state and that the film is formed, preferably, at a temperature higher than 150° C., more preferably, higher than 200° C. and, usually, from 400 to 500° C.

BRIEF DESCRIPTION OF THE DRAWINGS

FIGS. 1–36 are cross-sectional views wherein:

FIG. 1 shows an embodiment of a wiring structure obtained in accordance with the present invention;

FIG. 2 shows an embodiment (1) of the present invention;

FIG. 3 is an explanatory view for a comparative embodiment (1);

FIG. 4 is an explanatory view for a comparative embodiment (2);

FIG. 5 shows an embodiment (2) in accordance with the present invention;

FIG. 6 shows an embodiment (3) in accordance with the present invention;

FIG. 7 is an explanatory view for a comparative embodiment (3);

FIG. 8 is a view for the explanation of another embodiment according to the present invention;

FIG. 9 shows a first step in Example 1;

FIG. 10 shows a second step in Example 1;

FIG. 11 shows a third step in Example 1;

FIG. 12 shows a fourth step in Example 1;

FIG. 13 shows a fifth step in Example 1;

FIG. 14 shows a sixth step in Example 1;

FIG. 15 shows a first step in Example 2;

FIG. 16 shows a second step in Example 2;

FIG. 17 shows a third step in Example 2;

FIG. 18 shows a fourth step in Example 2;

FIG. 19 shows a first step in Example 3;

FIG. 20 shows a second step in Example 3;

FIG. 21 shows a third step in Example 3;

FIG. 22 shows a fourth step in Example 3;

FIG. 23 shows a fifth step in Example 3;

FIG. 24 shows a sixth step in Example 3;

FIG. 25 is a view showing the prior art;

FIG. 26 is a view showing a problem in the prior art;

FIG. 27 is a view showing a problem in the prior art;

FIG. 28 is a view showing a problem in the prior art;

FIG. 29 shows an embodiment of another aspect of the present invention (1);

FIG. 30 shows an embodiment of another aspect of the present invention (2);

FIG. 31 shows an embodiment of another aspect of the present invention (3);

FIG. 32 shows an embodiment of another aspect of the present invention (4);

FIG. 33 shows a first step in Example 4;

FIG. 34 shows a second step in Example 4;

FIG. 35 shows a third step in Example 4;

FIG. 36 shows a fourth step in Example 4; and

DESCRIPTION OF THE PREFERRED EMBODIMENTS

Description will now be made to the constitution and the effect of the first aspect of the present invention with reference to embodiments of FIGS. 1 to 6 illustrating constitutional examples of the present invention.

Figure 1:
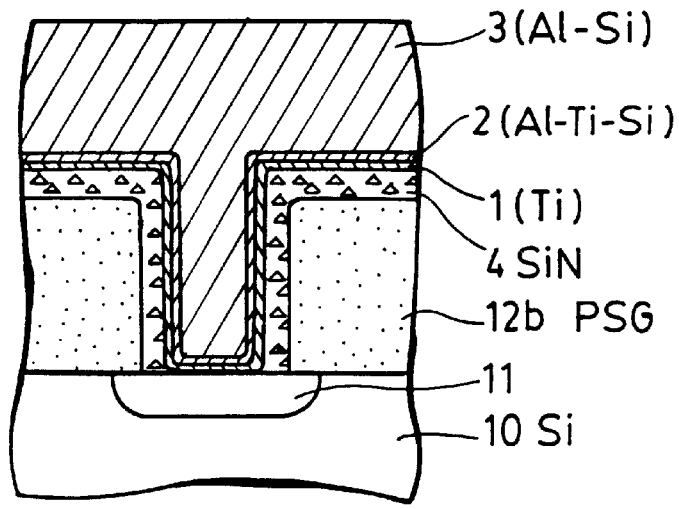

Referring to FIG. 1, in accordance with the present invention, a wiring structure as shown in FIG. 1 is obtained by forming a film of a silicon-containing metal 3 (an Al alloy containing 1 wt % of Si in this embodiment) on an underlying metal 1 (Ti in this illustrated embodiment) at a high temperature, thereby forming a silicon alloy layer 2 concerning the underlying metal 2 and the silicon-containing metal 3 (Al—Ti—Si ternary alloy in the illustrated embodiment) during film formation.

In the illustrated embodiment, an Al—Si series alloy as the silicon-containing metal 3 is formed into a film on Ti as the underlying metal 1 by a high temperature sputtering method, to absorb Si deposited from the silicon-containing metal 3 (Al—Si series alloy) into a silicon-containing metal/underlying metal boundary (Al/Ti boundary) reaction layer, thereby forming a Al—Ti—Si ternary alloy layer as a silicon alloy layer 2. to form an Al—Si series alloy wiring so as not to form Si nodules in the wiring film.

Figure 2:
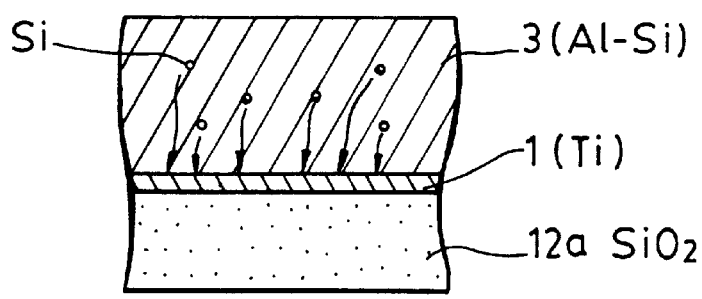
Figure 3:
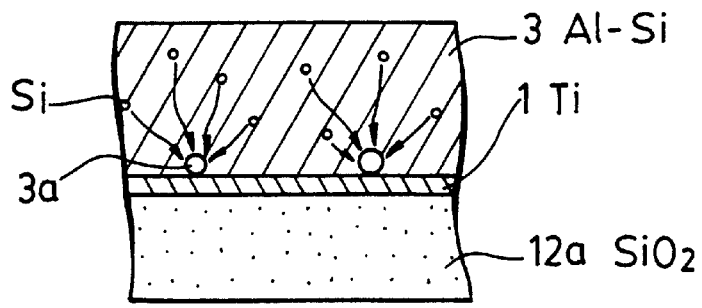
Figure 4:
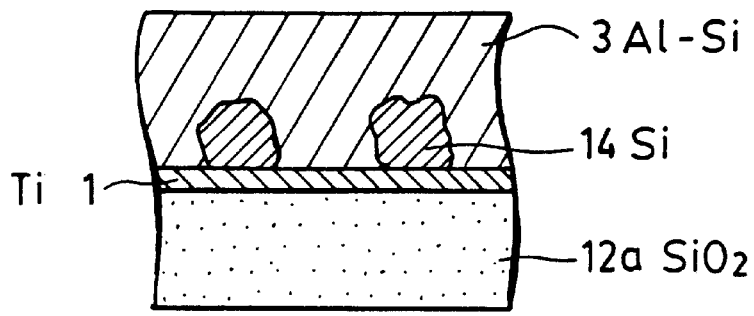

In this embodiment, a Ti film is at first formed as the underlying metal 1, on which an AlSi series alloy such as AlSi or AlSiCu (hereinafter simply referred to as Al—Si) as the silicon-containing metal 3 is formed into a film at a high temperature (refer to FIG. 2). During film formation, excess Si contained by an amount greater than the solid solubility limit in Al—Si as the silicon-containing metal 3 is deposited at the Al/Ti boundary as schematically shown in FIG. 2. In usual sputtering film formation with no high temperature heating, Si coagulated into nuclei 3a locally formed at the Al/Ti boundary as shown in FIG. 3 to result in Si nodules 14 as shown in FIG. 4.

Figure 5:
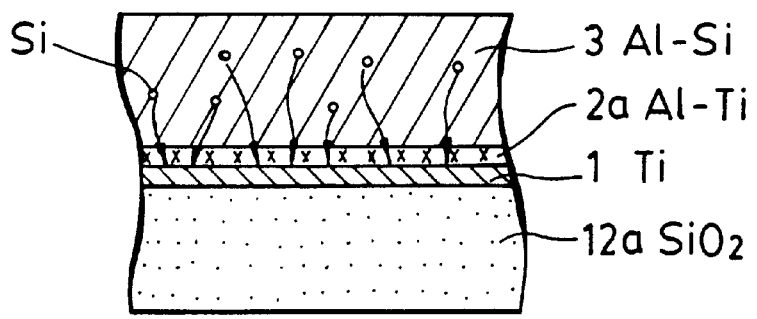
Figure 6:
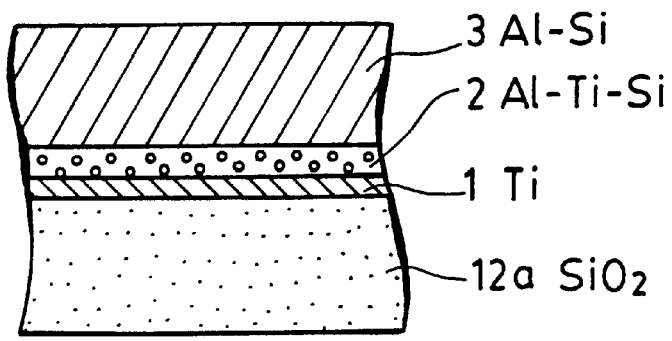

However, in a case of forming the film at a high temperature as in the present invention (high temperature sputtering film formation in this embodiment), boundary reaction proceeds rapidly between Al in the silicon-containing metal 1 and Ti as the underlying metal 1 during film formation, and deposited Si is absorbed in the reaction layer along with reaction between Al and Ti, uniformly diffuses in the reaction layer as schematically shown in FIG. 5 (Al—Ti reaction layer is shown by 2a in FIG. 5) and, finally, forms a silicon alloy layer 2 (Al—Ti—Si ternary alloy layer in this embodiment) as shown in FIG. 6.

As a result, no Si nodules are formed at the boundary of the silicon alloy layer 2 (ternary alloy layer) after the formation of the film. Further, Si does not deposit at the boundary of the silicon alloy layer 2 even after other heating steps such as Al sintering subsequent to the fabrication of the wiring pattern and no Si nodules are formed. In each of the drawings referred to above, the 12a, 12b denote interlayer insulation films which are made of $SiO_2$ (or PSG).

In the method according to the present invention, it is preferred that the boundary reaction proceeds rapidly between the silicon-containing metal 3 (Al—Si) and the underlying metal 1 (Ti) for preventing Si nodules.

Figure 7:
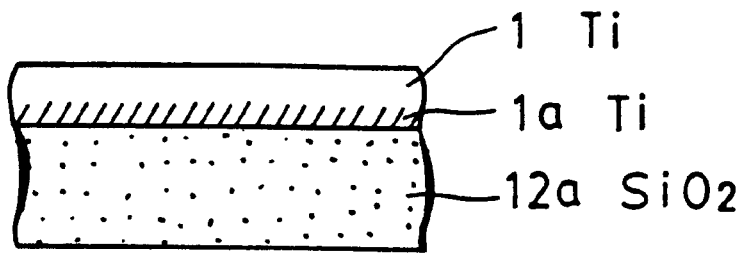
Figure 8:
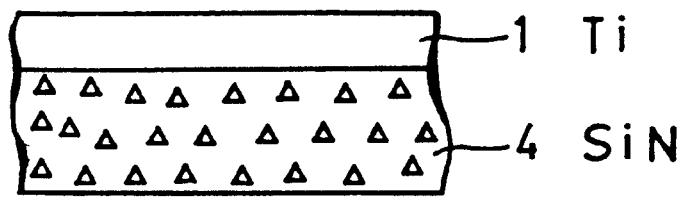

By the way, in a case where the underlying metal 1 is Ti, and when it is formed on a $SiO_2$ series it is brought into reaction with $SiO_2$ interlayer film 12a and oxidized to form titanium oxide 1a (refer to FIG. 7). On the other hand, it has been known that Ti is scarcely reacted and not oxidized in a case where it is formed on silicon nitride SiN layer 4 (refer to FIG. 8). Since reactivity with AlSi is also reduced if Ti is oxidized, it is effective to use SiN as the underlying =for the metal layer of Ti to prevent the deterioration of AlSi/Ti boundary reactivity for the prevention of Si nodules. Further, a structure in which SiN is formed at the surface of an interlayer film and side walls of a connection hole is effective for Al burying of the connection hole at a high aspect ratio by a high temperature sputtering and this structure can provide both of the advantageous effects of preventing Si nodules and providing satisfactory Al burying. FIG. 1 shows a wiring structure obtained by the preferred embodiment, in which are shown a SiN layer 4 and PSG 12b layer as the interlayer film, and a semiconductor substrate 10 such as a Si substrate.

Description will then be made to the constitution and the effect of the third aspect of the present invention with reference to FIGS. 29–32 illustrating embodiments of the present invention.

Figure 32:
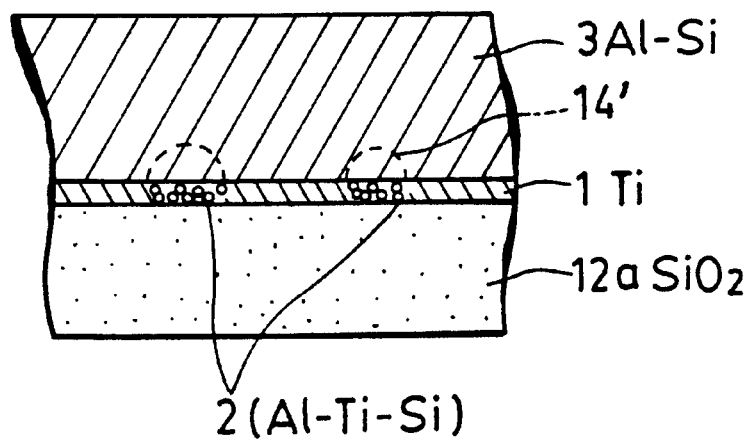
Figure 33:
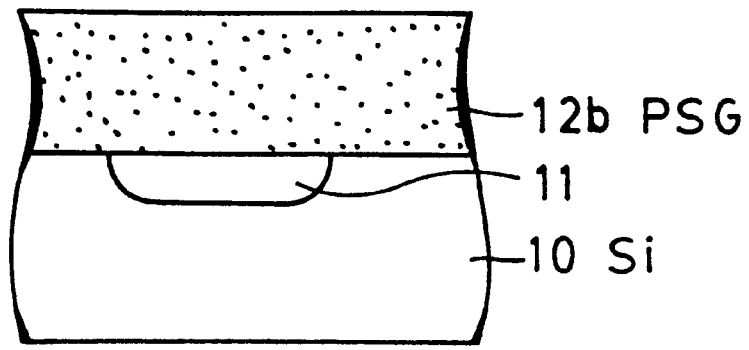

In this invention, a wiring structure as shown in FIG. 32 is obtained by forming a film from a silicon-containing metal 3 (Al alloy containing 1 wt % of Si in this embodiment) by a usual sputtering means or the like on an underlying metal 1 (in the illustrated embodiment) and, subsequently, applying a heat treatment, thereby forming a silicon alloy layer 2 comprising the underlying metal 1 and the silicon-containing metal 3 (Al—Ti—Si ternary alloy layer in the illustrated embodiment).

Figure 29:
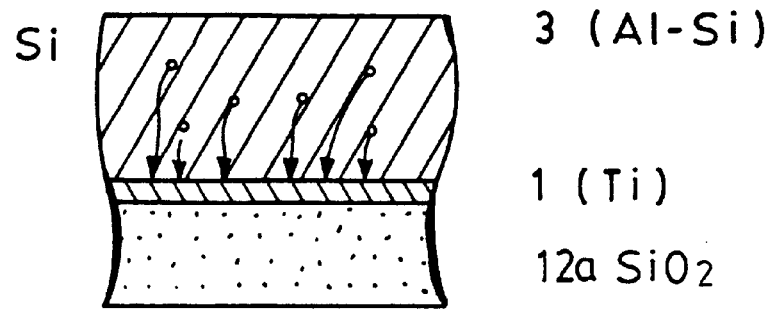
Figure 30:
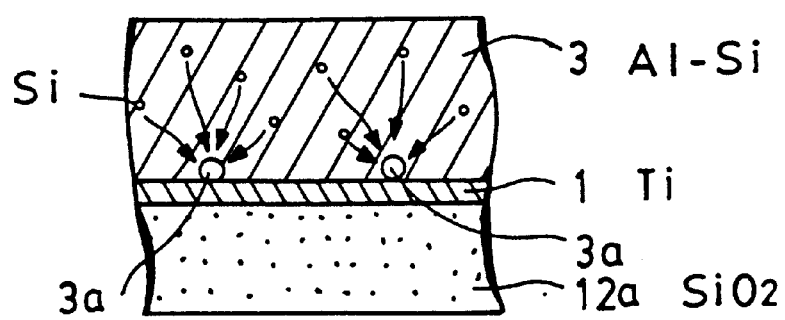
Figure 31:
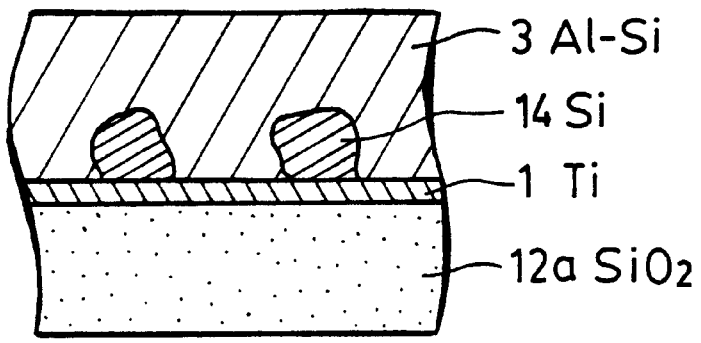

In the illustrated embodiment, an Al-Si series alloy (for example, Al—Si, Al—Si—Cu) as the silicon-containing metal 3 is formed into a film by a sputtering method on Ti as the underlying metal 1 (refer to FIG. 29). In this embodiment, the substrate is put at a not-heated state at a temperature near or lower than 150° C. during film formation. During film formation, Si contained by more than the solid solubility limit in the silicon-containing metal Al—Si alloy is deposited to the boundary between the silicon-containing metal 3 and the underlying metal 1, that is, Al/Ti boundary in this embodiment (refer to FIGS. 29, 30). During film formation, if the substrate is heated to about 500° C. as in the first aspect of the present invention described previously, boundary reaction between Al and Ti occurs during film formation, deposited Si is absorbed in the AlTi reaction layer to form an Al—Si—Ti ternary alloy leaving no Si nodules (refer to FIGS. 5 and 6 described previously).

However, in the case of using non-heated sputtering film formation as in this embodiment, if wirings are formed by a photoresist step and a RIE step while leaving the deposited Si as it is, wirings with locally reduced width and low reliability are formed as described previously (refer to FIG. 31). Further, Si nodule 3 remains as the etching residue under RIE conditions for Al, which also leads to deterioration of the reliability.

On the contrary in accordance with the third aspect of the present invention, after forming the silicon-containing metal such as an Al—Sl alloy film, a heat treatment is applied to absorb resultant Si nodules into the Al/Ti boundary along with the boundary forming reaction.

That is, in the present invention, after forming the film of the silicon-containing metal such as an Al—Si series alloy by a sputtering method on the underlying metal 1, for example, underlying Ti, the heat treatment step is applied to absorb Si deposited from the silicon-containing metal 2 (Al—Si alloy) to the boundary between the underlying metal 1 and the silicon-containing metal 2 (Al/Ti boundary) reaction layer and form an alloy layer (AlSiTi ternary alloy layer) of them, so that no Si nodules are formed in the wiring film. That is, as schematically shown in FIG. 32, deposited Si (shown in 14') is absorbed into the underlying metal 1 thereby forming the silicon alloy layer 2.

EXAMPLE

Descriptions will now be made to the examples of the present invention. It should be understood the present invention is not restricted to the examples to be described below.

Example 1

Descriptions will be made to a method of forming wirings in this example with reference to FIGS. 9–14.

Figure 9:
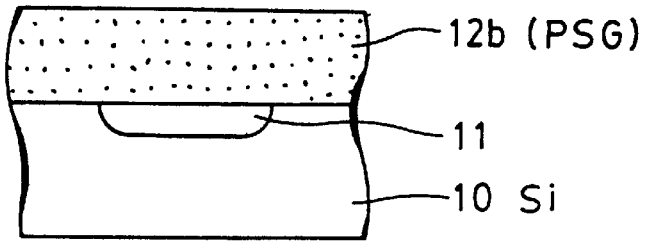

At first, an interlayer insulation film 12b was formed, for example, from PSG (refer to FIG. 9). The film thickness was set to 500 nm. In each of the drawings, are shown a Si substrate 10 and a Si diffusion layer 11.

Figure 10:
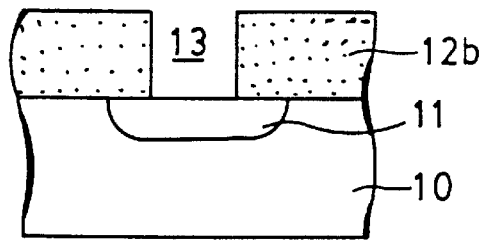
Figure 11:
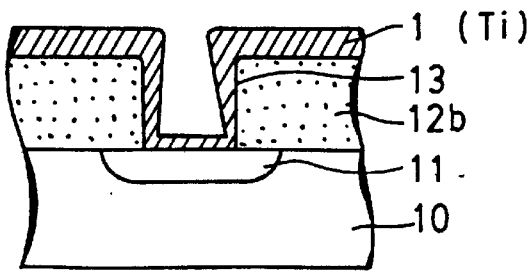
Figure 12:
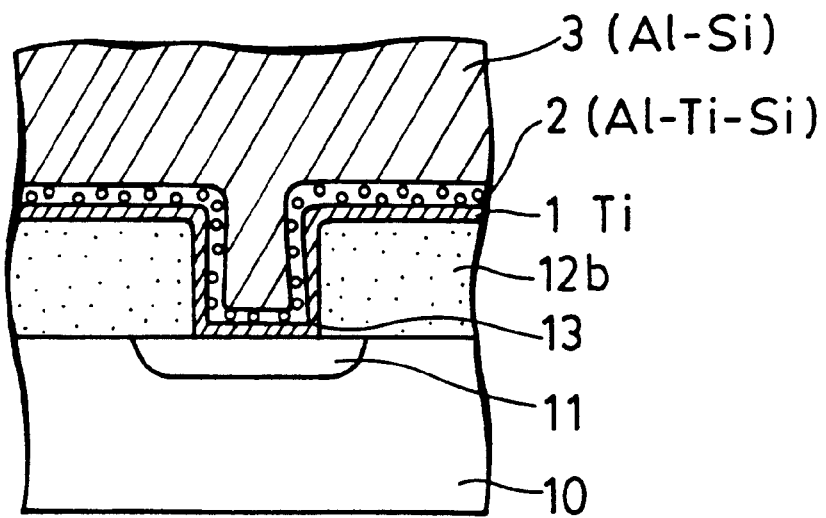
Figure 13:
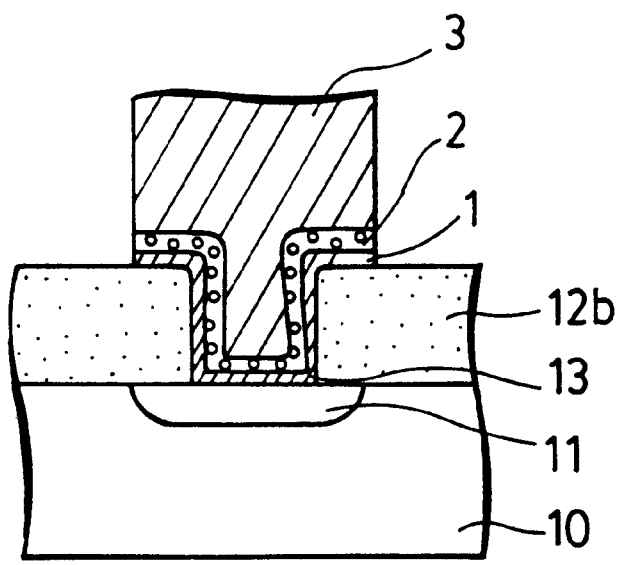

Then, a connection hole 13 was opened by usual photoresist step and RIE step (FIG. 10).

Then, film formation was conducted for Ti as an underlying metal 1 and AlSi as a silicon-containing metal 3 by a magnetron sputtering device. In this example, Ti was at first formed to a thickness of 100 nm as the underlying metal 1 by means of a usual sputtering method (refer to FIG. 11). Then, a film of Al—Si is formed by a high temperature sputtering to a thickness of 800 nm continuously without opening to atmospheric air to form a silicon-containing metal 3. The target composition used comprises Al—1 wt %Si but other compositions or Al—1 wt %Si—0.5 wt % Cu or the like may also be used.

Each of the film forming conditions is shown below. Ti film forming conditions:

| | |
|---|---|
| DC power | 4 kW |
| Process gas | Ar 100 SCCM |
| Sputtering pressure | 0.4 Pa |
| Substrate heating temperature | 150° C. |

Al—Si film forming conditions:

| | |
|---|---|
| DC power | 10 kW |
| Film-forming speed | 0.6 um/min |
| Process gas | Ar 100 SCCM |
| Sputtering pressure | 0.4 Pa |
| Substrate heating temperature | 500° C. |

Upon Al sputtering, a substrate bias of about 400 V may be used together in addition to the substrate heating.

After forming the wiring layer by the silicon-containing metal 3 under the foregoing conditions, an Al—Ti—Si ternary alloy layer as the silicon alloy layer 2 was formed at the Al/Ti boundary (refer to FIG. 12) with no formation of Si nodules.

Figure 14:
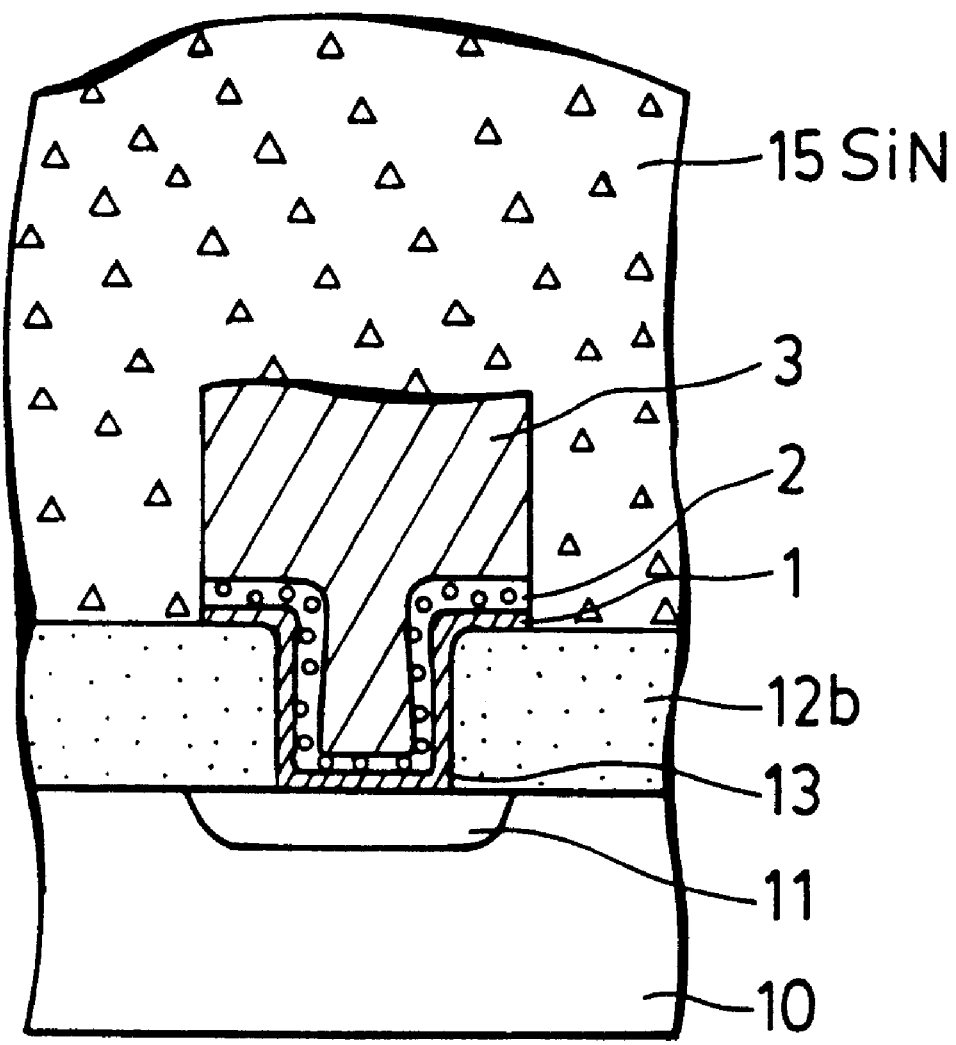
Figure 15:
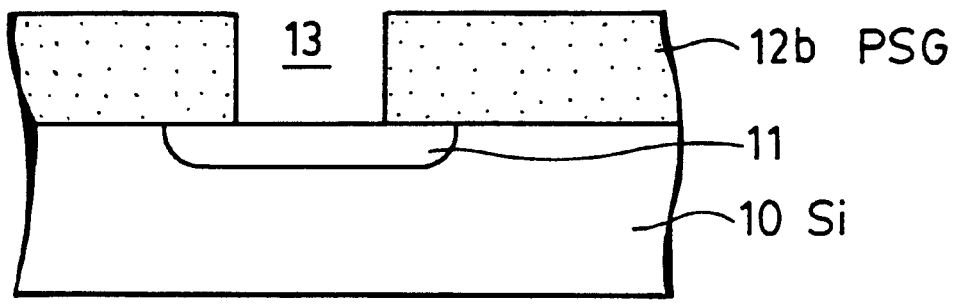
Figure 16:
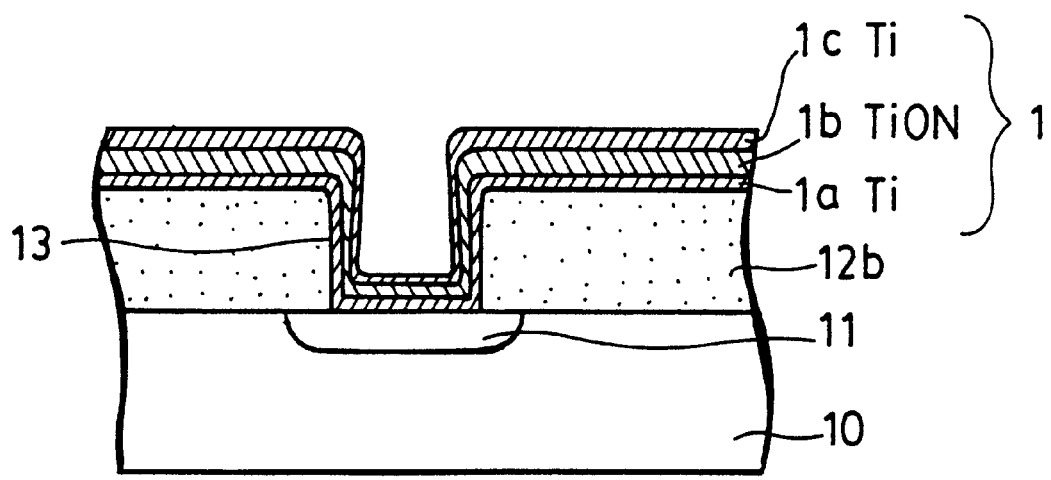
Figure 17:
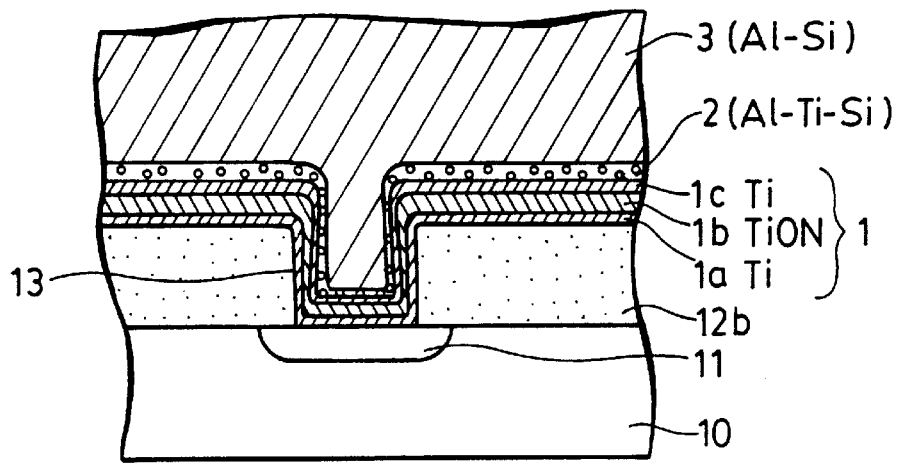

Subsequently, the wiring layer of the silicon-containing metal layer 3 was fabricated by etching into a wiring pattern by usual photoresist step and RIE step (refer to FIG. 13) and an overcoating 15 was formed over the entire surface (refer to FIG. 14). In this example, a SiN film was formed to 750 nm into the overcoating 15 by a plasma CVD process.

Further, Al sintering was applied. The condition was set to 400° C. and 60 min.

Even after the above-mentioned process after the formation of the Al film, Si was not deposited at the boundary of Al/Al—Ti—Si ternary alloy layer and Si nodules were not formed at all during wiring.

As described above in this example, Si nodules did not occur during Al alloy wiring and the reliability of the wiring was improved. Further, since flattening for the Al alloy layer can be conducted simultaneously with the high temperature sputtering, step coverage in the connection hole can be improved to further enhance the wiring reliability.

Example 2

Descriptions will now be made referring to FIGS. 15 to 18. Also in this example, an interlayer insulation film 12b such as PSG was at first formed and then a connection hole 13 was opened by means of usual photoresist step and RIE step (refer to FIG. 15). In the drawing, same reference numerals as those in Example 1 denote identical constitutional portions.

Then, a film formation of a wiring layer was conducted by a magnetron sputtering device. At first, a Ti layer 1a, a TiON layer 1b and a Ti layer 1c were formed, respectively by 30 nm, 100 nm and 30 nm by a usual sputtering method to form an underlying metal 1 with them (refer to FIG. 16).

In this case, the three layers were formed continuously by varying a DC power and a process gas flow rate in one chamber. Film forming conditions are shown below.

Film forming conditions for the first layer Ti:

| DC power | 4 kW |
|---|---|
| Process gas | Ar 100 SCCM |
| Sputtering pressure | 0.4 Pa |
| Substrate heating temperature | 150° C. |

Film forming conditions for TiON:

| DC power | 5 kW |
|---|---|
| Process gas | Ar 70 SCCM |
| | $N_2$-6% $O_2$- 40 SCCM |
| Sputtering pressure | 0.4 Pa |
| Substrate heating temperature | 150° C. |

Film forming conditions for second layer Ti:
Same as the film forming conditions for the first layer Ti.

In this case, TiN may also be used instead of TiON. As the film forming conditions in this case, the $N_2$—6%$O_2$ gas may be replaced with a purified $N_2$ gas.

Subsequently, a film of Al—Si as the silicon-containing metal 3 was formed by 800 nm by high temperature sputtering. The film forming conditions were same as those in Example 1. Also in this example, an Al—Ti—Si ternary alloy layer as the silicon alloy layer 2 was formed at the bottom of the Al layer upon forming the Al—Si film and Si nodules were not formed (refer to FIG. 17).

Figure 18:
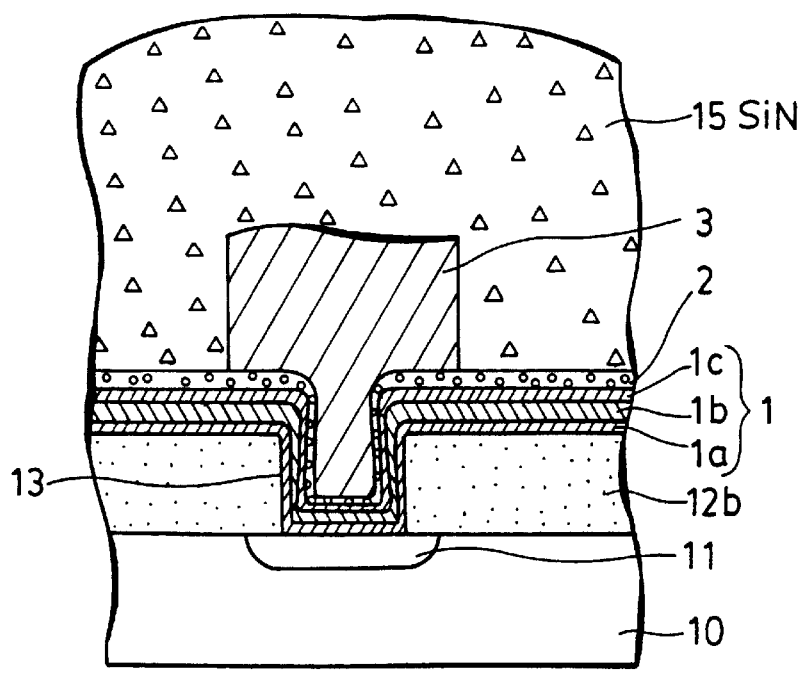
Figure 19:
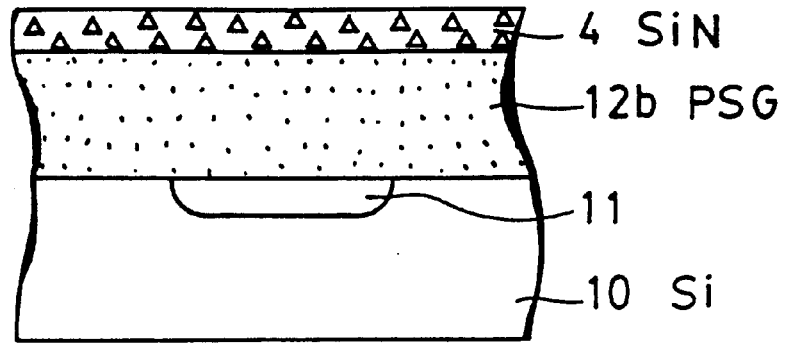

Subsequently, the wiring layer as the silicon-containing metal 3 was fabricated by etching into a wiring pattern by usual photoresist step and RIE step and, further, an overcoating 15 was formed over the entire surface. The conditions were identical as those in Example 1. Thus, a structure as shown in FIG. 18 was obtained.

Further, Al sintering was applied. The conditions were the same as those in Example 1.

Throughout the foregoing process up to the Al sintering. Si nodules were not formed at all during wiring like that in Example 1.

In this example, since TiON 1b (which may be TiN) was formed as a barrier metal, a barrier property with a Si diffusion layer 11 was made more reliable.

Example 3

Descriptions will be made with reference to FIGS. 19 to 25. An interlayer insulation film 12h such as PSG was at first formed, on which SiN 4 was further formed (refer to FIG. 19). Thickness of the films was made to 80 nm and 100 nm respectively. Further, SiN was formed by using a plasma CVD process. The film forming conditions for SiN film were as shown below. In the drawings, other reference numerals have the same meanings as described above.

Film forming condition:

| Gas system | $SiH_4/NH_3/N_2$ |
|---|---|
| Flow rate | 180/500/720 SCCM |
| Growing temperature | 200° C. |
| Pressure | 40 Pa |

Figure 20:
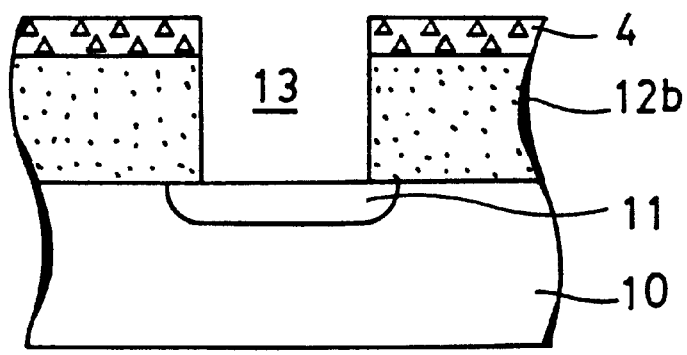

Then, a connection hole 13 was opened by usual photoresist step and RIF step (refer to FIG. 20).

Figure 21:
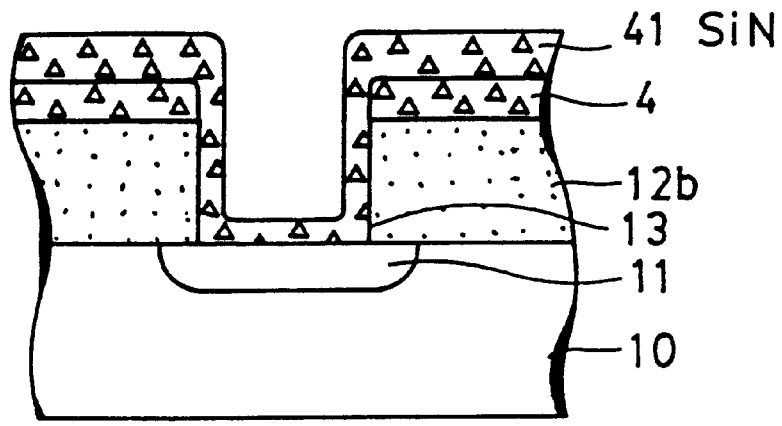

Then, a SiN film 41 was formed to 100 nm (refer to FIG. 21). Film forming conditions were the same as described above.

Figure 22:
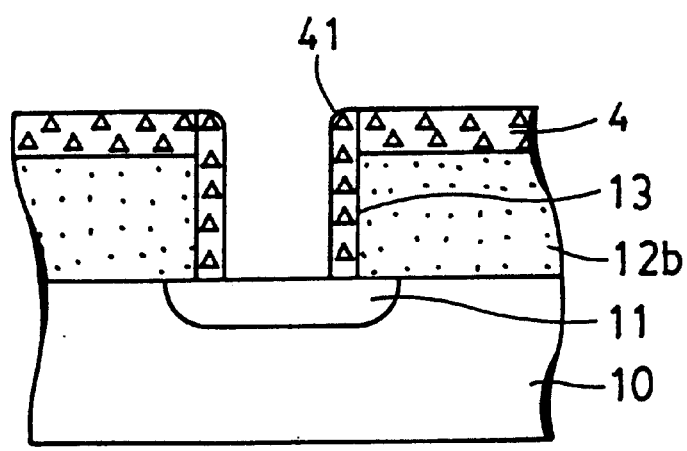

Then, the SiN film 41 was etched back by RIE, to leave SiN 41 on the side walls of the connection hole 13 while removing other portions to obtain a structure as shown in FIG. 22. Conditions in this case are shown below.

| RIE condition: | Gas | $CHF_3$ |
|---|---|---|
| | Flow rate | 75/25 SCCM |
| | RF power | 500 W |
| | Pressure | 5.3 Pa |

Figure 23:
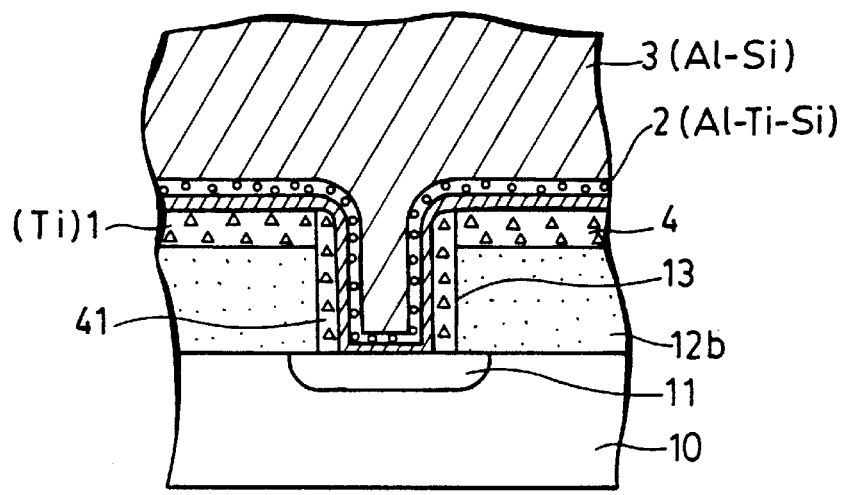

Then, a film of Ti (or Ti/TiON (TiN)/Ti) AlSi was formed as the underlying metal 1 by a magnetron sputtering device (refer to FIG. 23). Film forming conditions were the same as those in Example 1 or 2.

Figure 24:
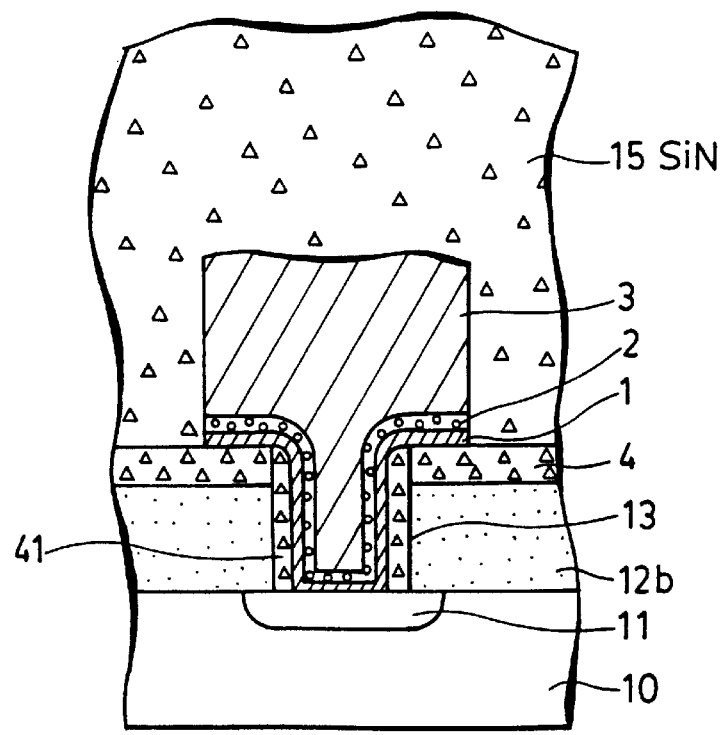
Figure 25:
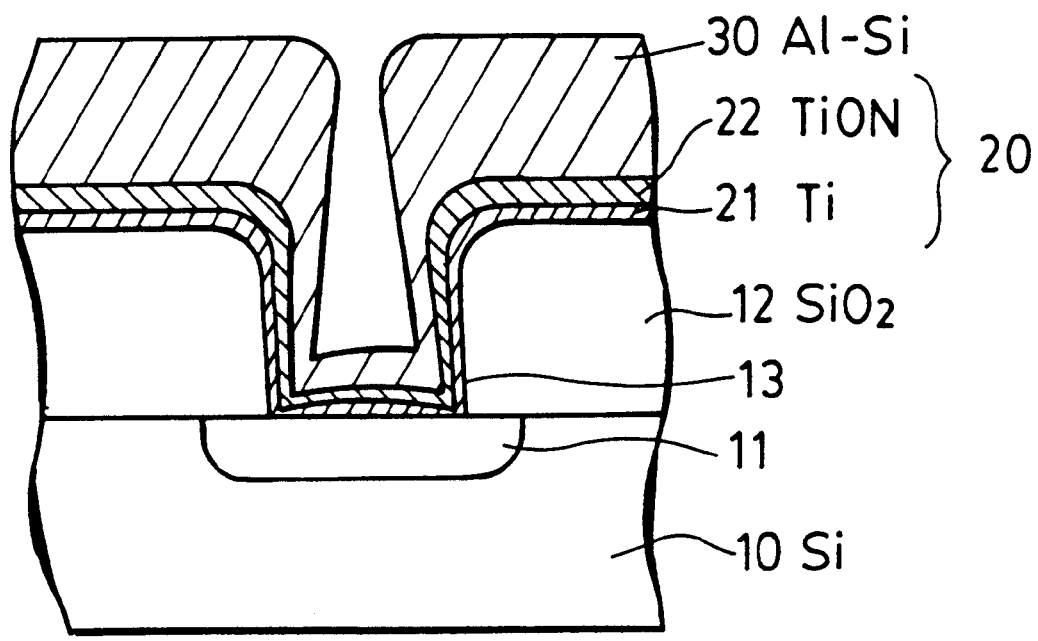
Figure 26A:
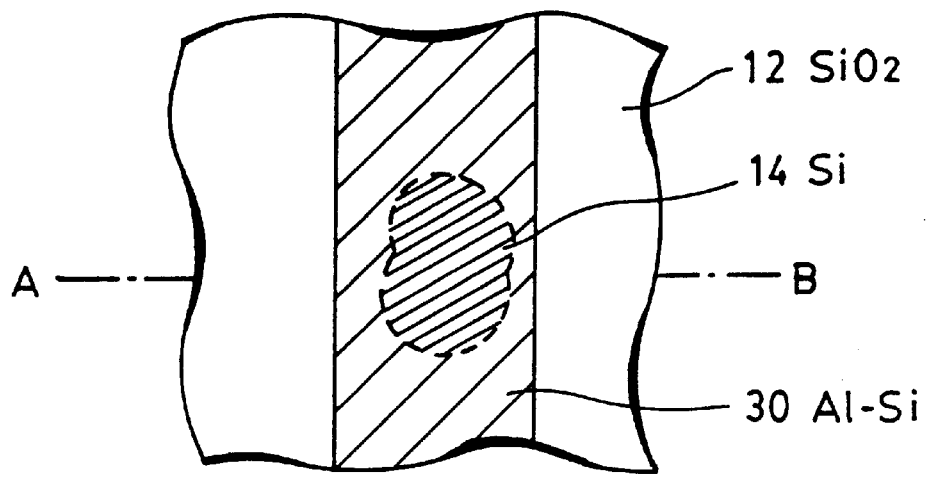
Figure 26B:
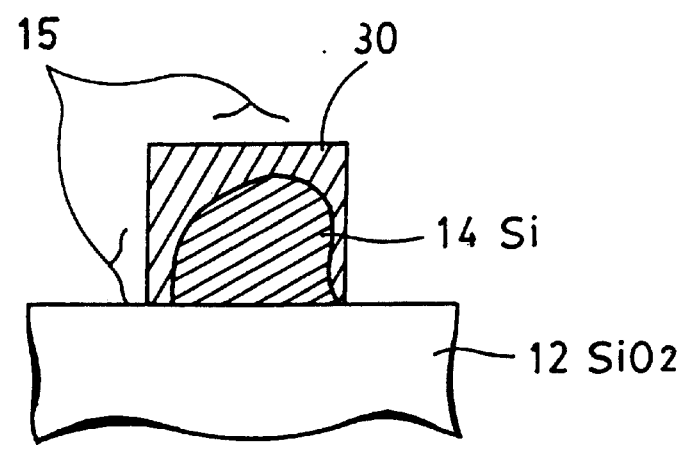
Figure 27A:
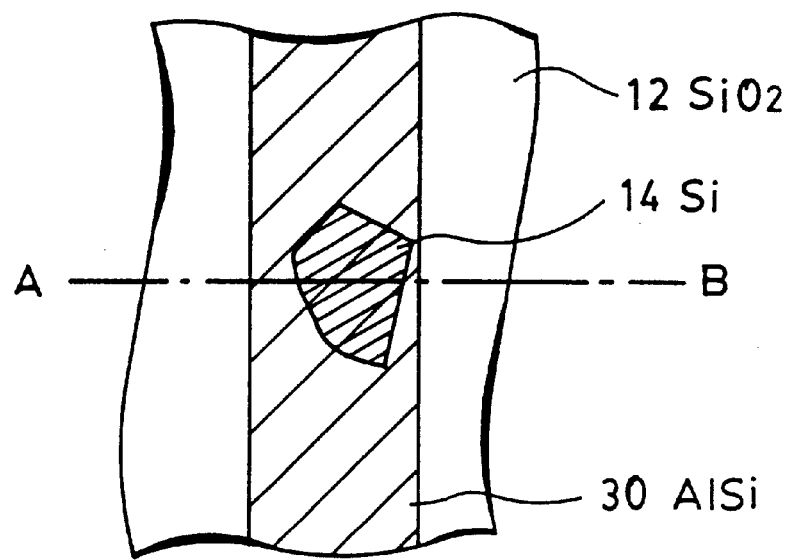
Figure 27B:
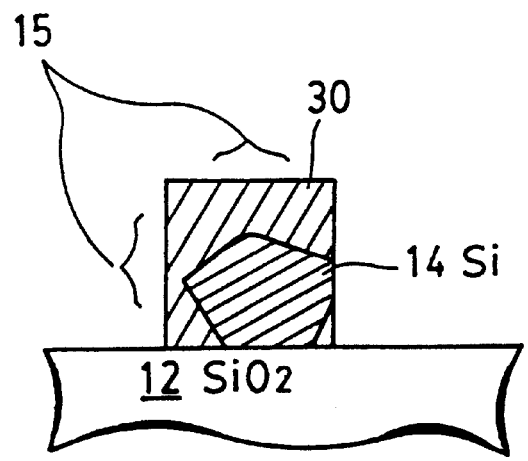
Figure 28:
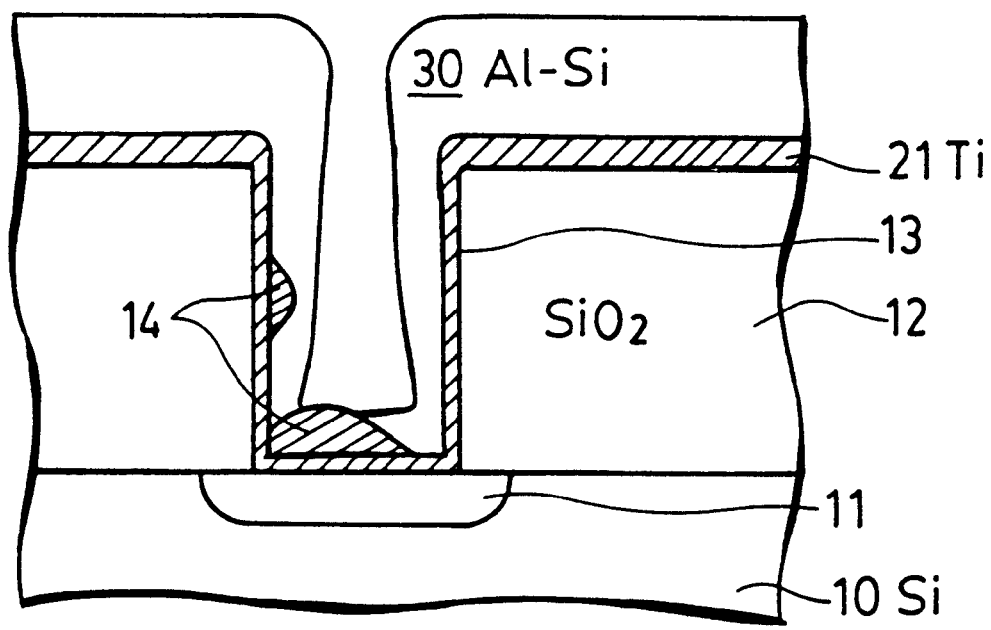

Subsequently, the wiring layer as the silicon-containing metal 3 was fabricated by etching into a wiring pattern by usual photoresist step and RIE step, on which an overcoating 15 was formed over the entire surface (refer to FIG. 24). Conditions were the same as those in Example 1.

Further, Al sintering was applied. Conditions were the same as those in Example 1.

In the foregoing example, since SiN layers 4 and 41 were present under the layer of Ti used as the underlying metal 1, oxidation of Ti can be prevented to improve the Si nodule preventive effect. Further, it can also be obtained an effect capable of satisfactory AlSi burying into a contact hole of high aspect ratio.

Example 4

Descriptions will be made with reference to FIGS. 33 to 36. In this example, an interlayer insulation film 12b such as of PSG was at first formed on a Si substrate 10 having a diffusion layer 11 (refer to FIG. 33).

Figure 34:
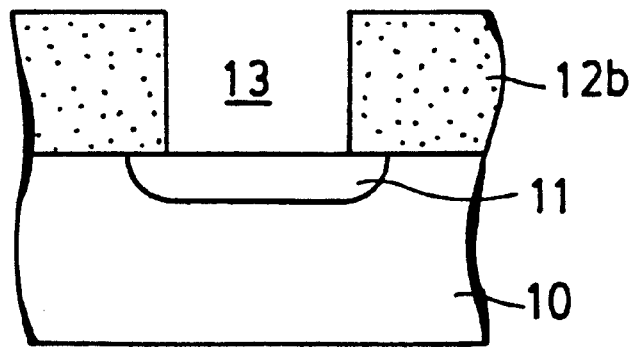

Then, a contact hole 13 was formed by usual photoresist step and RIE step (refer to FIG. 34).

Figure 35:
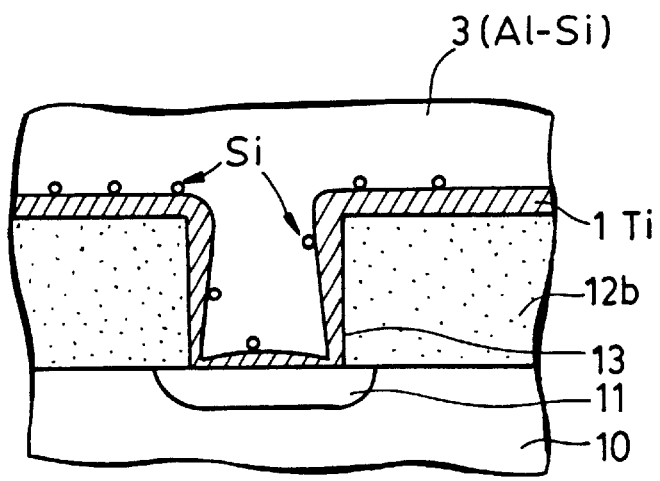

After forming a contact hole 13, film formation was conducted for Ti as an underlying metal 1 and an Al—Si series alloy as a silicon-containing metal 3 (refer to FIG. 35). In this case, an Al—1 wt %Si target was used but it may be replaced with other compositions, for example, Al—1 wt %Si—0.5 wt %Cu. Film forming conditions for Ti—Al—Si alloy are as shown below.

Ti film forming conditions:

| Film thickness | 100 nm |
|---|---|
| DC power | 4 kW |
| Process gas | Ar 100 SCCM |
| Sputtering pressure | 0.4 Pa (3 mTorr) |
| Substrate heating temperature | 150° C. |

Al—1 wt %Si film forming conditions:

| Film thickness | 100 nm |
| --- | --- |
| DC power | 4 kW |
| Process gas | Ar 100 SCCM |
| Sputtering pressure | 0.4 Pa (3 mTorr) |
| Substrate heating temperature | 150° C. |

After continuously forming films of Ti and Al—Si alloys continuously in vacuum under the foregoing conditions, Si deposits were present at the Al—Ti boundary (refer to FIG. 35).

Then, furnace annealing was conducted in this example to cause Al/Ti boundary reaction, to absorb the deposited Si at the boundary. Conditions for furnace annealing are as shown below.

| Furnace annealing conditions: | Temperature | 500° C. |
| --- | --- | --- |
| | time | 800 min |
| | process gas | forming gas |

Figure 36:
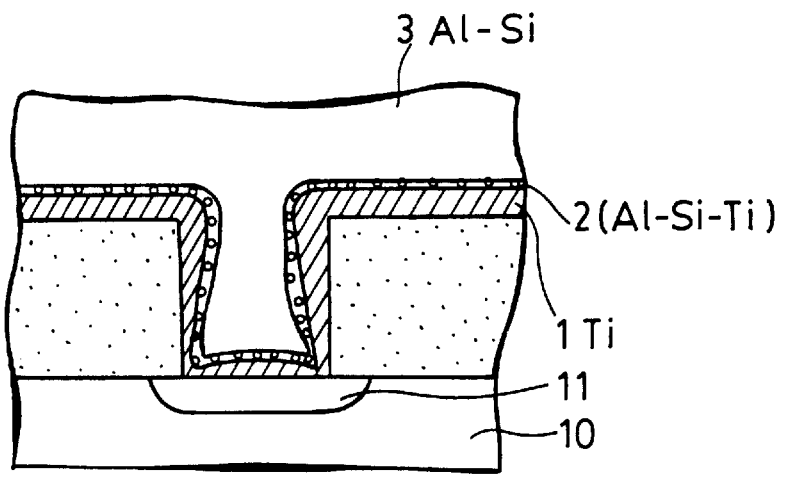

After the heat treatment, an Al—Si—Ti ternary alloy was formed at the Al/Ti boundary as a silicon alloy layer 2 and Si nodules were eliminated (refer to FIG. 36).

Subsequently, etching was applied to form a wiring pattern by usual photoresist step end RIF step, on which an overcoating (for example P—SiN, 750 nm) was formed, and no Si nodules were formed at the Al/AlSiTi ternary alloy boundary.

Example 5

Using the same conditions as described above in Example 4, an Al—Si series alloy film was formed on Ti (refer to FIG. 35). Si nodules were present at the Al—Ti surface.

Then, in this example, an Al/Ti boundary reaction was caused by RTA (Rapid Thermal Annealing) and Si nodules were absorbed in the boundary (refer to FIG. 36). RTA conditions were as follows:

| RTA condition: | Temperature | 500° C. |
| --- | --- | --- |
| | Time | 1 min |
| | Process gas | Ar |

Example 6

Figure 37:
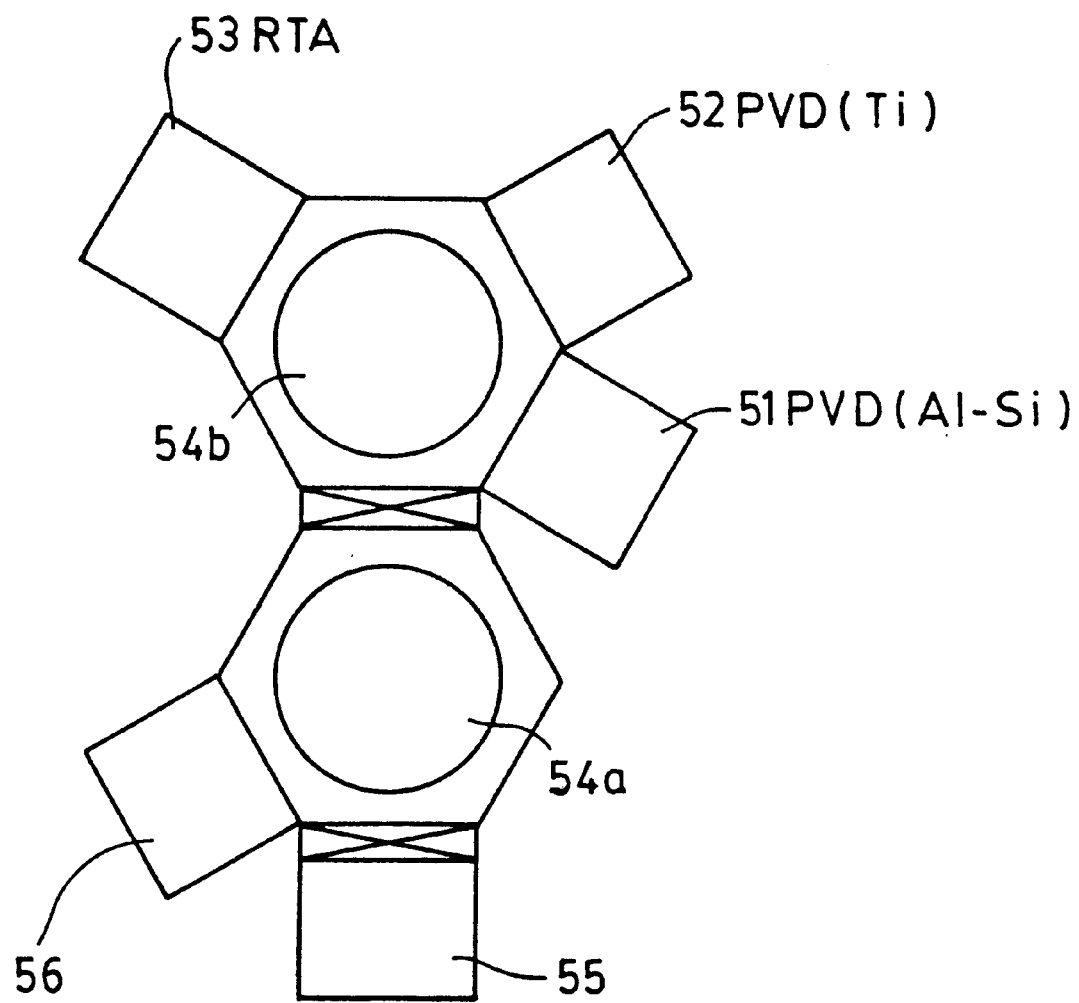
FIG. 37 is a diagrammatic view of a multi-chamber film forming device used in preparing Examples of the invention.

The process in Example 5 was practiced by using a multi-chamber type device shown in FIG. 37 having each of reaction chambers, that is, an Al—Si series alloy sputter chamber 51, Ti sputter chamber 52 and RTA (heat treatment in Ar atmosphere) chamber 53. In FIG. 37, are shown conveying chambers 54a. 54b, a load lock chamber 55 and a precleaning chamber 58.

In the method of this example, since Ti sputtering, Al—Si alloy sputtering and RTA are continuously applied in vacuum, oxidation of the underlying Ti due to atmospheric exposure can be prevented and it is possible to easily cause AlTi reaction. Accordingly, deposited Si is absorbed to easily form the Al—Si—Ti ternary alloy.

According to the present invention, in a case of forming wirings by a silicon-containing metal layer (for example, a silicon-containing aluminum series material). occurrence of Si nodules can be eliminated to obtain wirings of high reliability.

What is claimed is:

1. A method of forming wirings for a semiconductor device comprising the steps of:

providing a semiconductor substrate having a diffusion region contained therein;

depositing an interlayer insulating layer on the semiconductor substrate;

forming at least one contact hole with side walls by removing a portion of the interlayer insulating layer to expose a selected portion of the surface of the semiconductor substrate;

depositing a silicon nitride layer on the insulating layer, the exposed surfaces and on the side walls of each contact hole;

depositing an underlying metal layer on the silicon nitride layer;

heating the substrate; and then forming an electrically conductive layer free of Si nodules by depositing a layer of aluminum material containing silicon on the underlying metal layer by sputtering at an elevated temperature and simultaneously forming an intermediate layer of an alloy of aluminum, silicon and a metal of the underlying metal layer between the underlying metal layer and the electrically conductive layer, said step of depositing an underlying metal layer and the step of depositing an electrically conductive layer being performed in an atmosphere free of atmospheric air.

2. A method according to claim 1, wherein the underlying metal layer is a composite layer having a Ti/TiON/Ti sandwich structure.

3. A method according to claim 1, wherein said underlying metal layer comprises a composite layer of Ti and TiON.

4. A method according to claim 3, wherein said composite layer has a Ti/TiON sandwich structure.

5. A method according to claim 1, wherein said elevated temperature is 200° C. or above.

6. A method according to claim 2, wherein the elevated temperature is $\geq 200°$ C.

7. A method according to claim 3, wherein the elevated temperature is $\geq 200°$ C.

8. A method according to claim 4, wherein the elevated temperature is $\geq 200°$ C.

* * * * *